United States Patent
Kim et al.

(10) Patent No.: US 10,211,272 B2
(45) Date of Patent: Feb. 19, 2019

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: JongSung Kim, Paju-si (KR); JongGeun Yoon, Gunpo-si (KR); Goeun Jung, Goyang-si (KR); HyungGeun Kwon, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/297,973

(22) Filed: Oct. 19, 2016

(65) Prior Publication Data
US 2017/0154942 A1    Jun. 1, 2017

(30) Foreign Application Priority Data
Nov. 30, 2015    (KR) ........................ 10-2015-0169405

(51) Int. Cl.
*H01L 27/32* (2006.01)
*H01L 51/52* (2006.01)
*H01L 51/56* (2006.01)

(52) U.S. Cl.
CPC ........ *H01L 27/3272* (2013.01); *H01L 27/322* (2013.01); *H01L 27/3246* (2013.01); *H01L 51/5246* (2013.01); *H01L 51/5284* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 9,548,342 B2 | 1/2017 | Baek et al. |
| 2004/0263670 A1* | 12/2004 | Yamasaki ............. G06F 3/0412 348/340 |
| 2007/0108899 A1* | 5/2007 | Jung ................... H01L 27/3276 313/506 |
| 2009/0284135 A1 | 11/2009 | Yoshida et al. |

(Continued)

FOREIGN PATENT DOCUMENTS

| EP | 2960962 A1 | 12/2015 |
| JP | 2004-319118 A | 11/2004 |

(Continued)

*Primary Examiner* — Lex H Malsawma
(74) *Attorney, Agent, or Firm* — Birch, Stewart, Kolasch & Birch, LLP (57) ABSTRACT

Discussed are an organic light emitting display device and a method of manufacturing the same. The organic light emitting display device can include first electrodes that are disposed on a substrate, organic light-emitting layers that are disposed on the first electrodes, banks that overlap edges of the first electrodes and define pixels, light-blocking layers that are disposed on the banks, and resin layers that are disposed between the light-blocking layers and include an adhesive material. A resin transfer pattern that penetrates each of the light-blocking layers from one side to the other side may be formed in the light-blocking layers. The resin layer disposed on one side of each of the light-blocking layers and the resin layer disposed on the other side of the light-blocking layer are connected to each other via the resin transfer pattern.

13 Claims, 6 Drawing Sheets

(56) References Cited

U.S. PATENT DOCUMENTS

| | | | |
|---|---|---|---|
| 2011/0024726 A1 | 2/2011 | Lee et al. | |
| 2014/0042424 A1* | 2/2014 | Yamakita | H01L 27/3211 257/40 |
| 2014/0284572 A1 | 9/2014 | Oooka et al. | |
| 2015/0060827 A1 | 3/2015 | Sasaki et al. | |
| 2015/0090991 A1* | 4/2015 | Ishii | H01L 51/525 257/40 |
| 2015/0187857 A1 | 7/2015 | Negishi et al. | |
| 2015/0362776 A1* | 12/2015 | Jikumaru | H01L 27/124 349/12 |
| 2017/0069694 A1 | 3/2017 | Ajiki et al. | |

FOREIGN PATENT DOCUMENTS

| | | |
|---|---|---|
| JP | 2007-103027 A | 4/2007 |
| JP | 2011-14455 A | 1/2011 |
| WO | WO 2010/128593 A1 | 11/2010 |
| WO | WO 2015/136579 A1 | 9/2015 |

* cited by examiner

ORGANIC LIGHT EMITTING DISPLAY DEVICE AND METHOD OF MANUFACTURING THE SAME

CROSS REFERENCE TO THE RELATED APPLICATIONS

This non-provisional application claims the benefit under 35 U.S.C. § 119(a) to Korean Patent Application No. 10-2015-0169405, filed in Republic of Korea on Nov. 30, 2015, which is hereby expressly incorporated by reference into the present application.

BACKGROUND OF THE INVENTION

Field of the Invention

The present invention relates to an organic light emitting display device, and more particularly, to a top emission type organic light emitting display device and a method of manufacturing the organic light emitting display device.

Discussion of the Related Art

An organic light emitting display (OLED) device is a spontaneous emission device and has characteristics such as lower power consumption, high response speed, high emission efficiency, high luminance, and wide viewing angle. Organic light emitting display (OLED) devices are classified into a top emission type and a bottom emission type depending on transmission directions of light emitted from the organic light emitting display devices. The bottom emission type has a disadvantage that an aperture ratio decreases due to a circuit element which is located between a light-emitting layer and an image display surface. On the other hand, the top emission type has a benefit that an aperture ratio increases because a circuit element is not located between a light-emitting layer and an image display surface.

Figure 1:
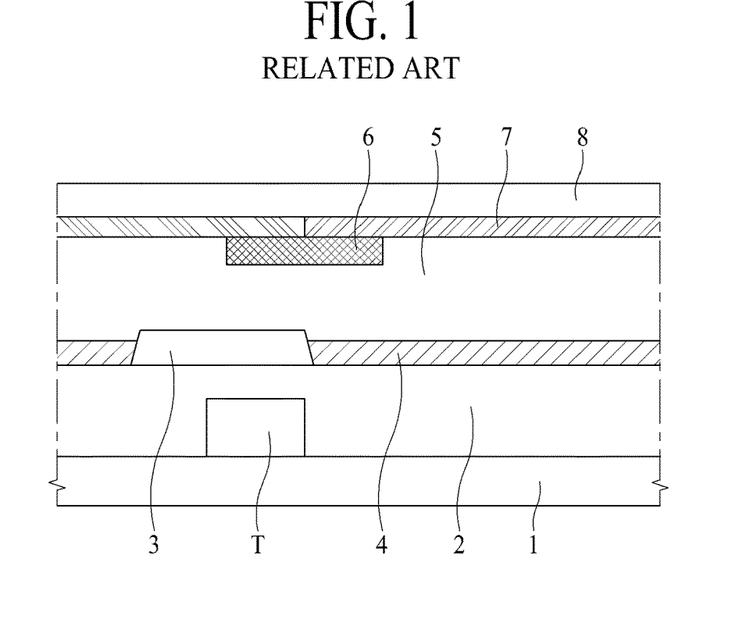
FIG. 1 is a schematic cross-sectional view of an organic light emitting device in the related art.

FIG. 1 is a schematic cross-sectional view of an organic light emitting display device in the related art. As illustrated in FIG. 1, the organic light emitting display device in the related art is configured by bonding a first substrate 1 and a second substrate 8.

In such an organic light emitting display device according to the related art, a thin film transistor T including an active layer, a gate insulating film, a gate electrode, an insulating interlayer, a source electrode, and a drain electrode is disposed on the first substrate 1, and a planarization layer 2 is disposed on the thin film transistor T. A bank 3 is disposed on the planarization layer 2, and light-emitting layers 4 are disposed on both sides of the bank 3. A resin layer 5 is disposed on the entire light-emitting layers 4. Color filters 7 are disposed on the entire surface of the second substrate 8, and a light-blocking layer 6 is disposed on the color filters 7.

In order to prevent mixture of light from the light-emitting layers 4, it is preferable that the light-blocking layer 6 be disposed on the bank 3. However, in the organic light emitting display device according to the related art, the light-blocking layer 6 may not be accurately arranged on the bank 3 due to a process error in the process of bonding the first substrate 1 and the second substrate 8. Accordingly, the light-blocking layer 6 may be superimposed on the light-emitting layers 4 to block light from the light-emitting layers 4. As a result, the organic light emitting display device according to the related art has a problem in that an aperture ratio and optical uniformity decrease to deteriorate image quality of the organic light emitting display device.

SUMMARY OF THE INVENTION

Accordingly, the present invention provides a display device that substantially obviates one or more problems due to limitations and disadvantages of the related art. An object of the present invention is to provide an organic light emitting display device that can prevent a problem with a decrease in aperture ratio and image quality and a method of manufacturing the organic light emitting display device.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure described below as well as the appended drawings.

In order to achieve the above-mentioned object, the present invention provides an organic light emitting display device including first electrodes that are disposed on a first substrate; organic light-emitting layers that are disposed on the first electrodes; banks that overlap edges of the first electrodes and define pixels; light-blocking layers that are disposed on the banks; and resin layers that are disposed between the light-blocking layers and include an adhesive material, wherein a resin transfer pattern that penetrates each of the light-blocking layers from one side to the other side is formed in the light-blocking layers and the resin layer disposed on one side of each of the light-blocking layers and the resin layer disposed on the other side of the light-blocking layer are connected to each other via the resin transfer pattern, and a method of manufacturing the organic light emitting display device.

According to an aspect of the invention the organic light emitting display device may include first electrodes disposed on a substrate; organic light-emitting layers disposed on the first electrodes; a bank that overlap edges of the first electrodes and define pixels; a light-blocking layer disposed on the bank; and resin layers on the organic light-emitting layers; a resin transfer pattern in the light-blocking layer for connecting resin layers in adjacent pixels, and a second substrate on the resin layers.

Preferably, the resin transfer pattern may penetrate the light-blocking layer from one side to the other side and is formed in the light-blocking layers. The resin layer may be disposed on one side of the light-blocking layer and the resin layer disposed on the other side of the light-blocking layer are connected to each other via the resin transfer pattern. Preferably, the resin transfer pattern may be formed inside the light-blocking layer and may be formed in a curved form allowing a fluid to pass and blocking the passing of light. Preferably, the one end and the other end of the resin transfer pattern do not face each other.

Preferably, the light-blocking layer may be disposed to surround at least two sides of each pixel. Preferably, at least one resin transfer pattern is disposed between adjacent pixels. Preferably, the resin transfer pattern of adjacent pixels may be disposed to connect the resin layers as one body.

Preferably, the bank is wider than the light-blocking layer disposed on the bank. The bank may have portions at both sides which are not covered by the light-blocking layer. Preferably, the resin transfer pattern may include introduction portions orientated to adjacent resin layers. Preferably, the introduction portions may be offset to each other to block transmission of light from one introduction portion to the other introduction portion of the resin transfer pattern. Preferably, the introduction portions may be offset to each other by at least the diameter or width of one introduction portion.

Preferably, the resin transfer pattern may include at least one curvature or angle blocking transmission of light from one introduction portion to the other introduction portion of the resin transfer pattern. Preferably, the resin transfer pattern may be partly or fully surrounded by the light blocking layer.

According to another aspect the problems are solved by a method of manufacturing an organic light emitting display device, including forming first electrodes in a display area on a first substrate having the display area and a non-display area; forming banks on side faces of the first electrodes; forming organic light-emitting layers on the first electrodes; forming light-blocking layers including a resin transfer pattern on a second electrode so as to be superimposed on the banks; forming a dam in a frame shape in a boundary between the display area and the non-display area so as to have the same height as the light-blocking layers; forming resin layers including an adhesive material on the second electrode so as to have the same height as the dam; and bonding a second substrate including color filters onto the resin layers including the adhesive material.

The forming of the light-blocking layers on the second electrode so as to be superimposed on the banks may include forming the light-blocking layers such that the resin transfer pattern has a shape which is curved at least one time. The forming of the light-blocking layers on the second electrode so as to be superimposed on the banks may include forming the light-blocking layers such that one end and the other end of the resin transfer pattern do not face each other. The light-blocking layers are not superimposed on the organic light-emitting layers.

It is to be understood that both the foregoing general description and the following detailed description of the present invention are provided as examples and are intended to provide further explanation of the invention as claimed.

BRIEF DESCRIPTION OF THE DRAWINGS

The accompanying drawings, which are included to provide a further understanding of the disclosed subject matter and are incorporated in and constitute a part of this application, illustrate embodiments of the disclosed subject matter and together with the description serve to explain the principle of the disclosed subject matter. In the drawings.

DETAILED DESCRIPTION OF THE EMBODIMENTS

Meanings of terms which are used in the specification should be understood as follows.

A singular expression of an element includes two or more elements unless differently mentioned. Terms "first", "second", and the like are used only to distinguish an element from another, and the scope of the invention should not be limited by the terms. Terms "include," "have", and the like should be understood not to exclude possibilities of presence or addition of one or more other features, numerals, steps, operations, elements, components, or combinations thereof. The item "at least one" should be understood to include all possible combinations of one or more relevant items. For example, "at least one of a first item, a second item, and a third item" individually means the first item, the second time, or the third item and also means all possible combinations of two or more of the first item, the second item, and the third item. The term "on" means a case in which one element is formed directly on the top surface of another element and a case in which a third element is interposed between the elements.

Organic light emitting display devices according to embodiments of the present invention will be described below with reference to the accompanying drawings. Like reference numerals in the entire drawings denote like elements. When it is determined that detailed description of known techniques or functions involved in the invention makes the gist of the invention obscure, the detailed description thereof will not be made.

Figure 2:
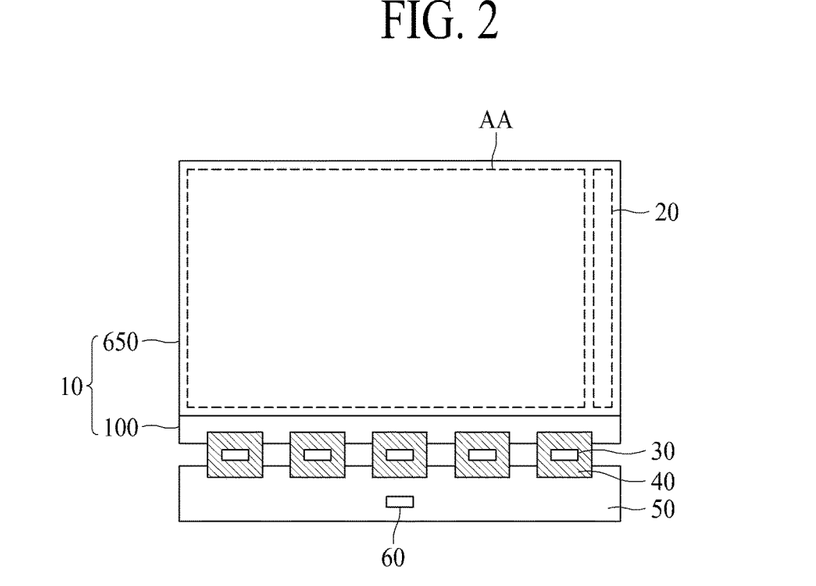
FIG. 2 is a schematic plan view of an organic light emitting display device according to an embodiment of the present invention.

FIG. 2 is a schematic plan view of an organic light emitting display device according to an embodiment of the present invention. Referring to FIG. 2, the organic light emitting display device according to an embodiment of the present invention includes a display panel 10, a gate drive unit 20, a source drive integrated circuit (hereinafter, referred to as "IC") 30, a flexible film 40, a circuit board 50, and a timing controller 60.

The display panel 10 includes a first substrate 100 and a second substrate 650. The second substrate 650 may be an encapsulated substrate. Here, the first substrate 100 may be formed to be larger than the second substrate 650, and thus a part of the first substrate 100 may be exposed from the second substrate 650.

Gate lines, data lines, and pixels P which are arranged in intersection areas of the gate lines and the data lines are formed in a display area AA of the display panel 10. The pixels P in the display area AA can display an image. Details of the display area AA will be described later with reference to FIG. 3.

The gate drive unit 20 supplies gate signals to the gate lines in response to a gate control signal input from the timing controller 60. The source drive IC (30) receives digital video data and a source control signal from the timing controller 60. The source drive IC 30 converts the digital video data into analog data voltages and supplies the data voltages to the data lines in response to the source control signal. When the source drive IC 30 is formed as a drive chip, the source drive IC 30 may be mounted on the flexible film 40 in a chip-on-film (COF) or chip-on-plastic (COP) manner.

Since the first substrate 100 is larger than the second substrate 650, a part of the first substrate 100 is not covered with the second substrate 650 but is exposed. The part of the first substrate 100 which is not covered with the second substrate 650 but is exposed is provided with pads such as data pads.

Lines for connecting the pads to the source drive IC 30 and lines for connecting the pads to lines of the circuit board 50 may be formed in the flexible film 40. The flexible film 40 is attached to the pads using an anisotropic conducting film and thus connects the pads to the lines of the flexible film 40.

The circuit board 50 can be attached to the flexible film 40. Plural circuits which are embodied as drive chips may be mounted on the circuit board 50. For example, the timing controller 60 may be mounted on the circuit board 50. Here, the circuit board 50 may be a printed circuit board or a flexible printed circuit board.

The timing controller 60 receives digital video data and a timing signal from an external system board (not illustrated). At this time, the timing controller 60 generates a gate control signal for controlling the operation timing of the gate drive unit 20 and a source control signal for controlling the source drive IC 30 on the basis of the timing signal. The timing controller 60 supplies the gate control signal to the gate drive unit 20 and supplies the source control signal to the source drive IC 30.

Figure 3:
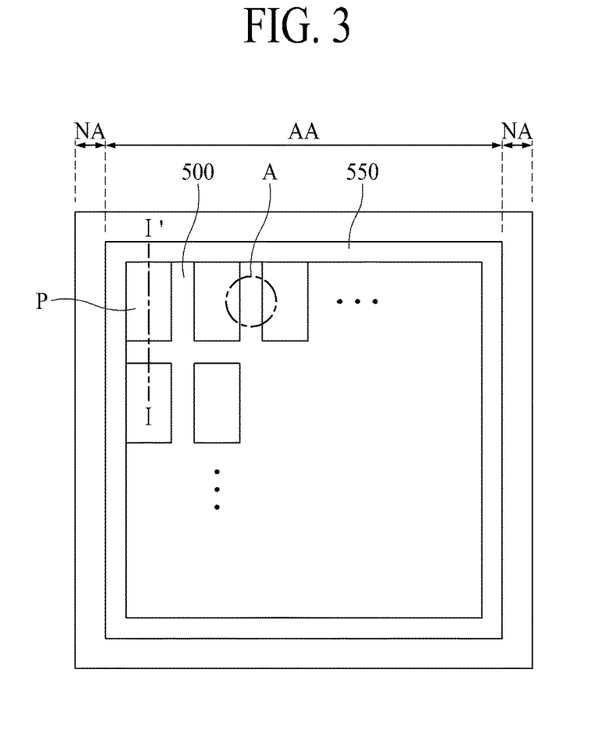
FIG. 3 is an enlarged view of a display panel in the plan view of FIG. 2.
Figure 4:
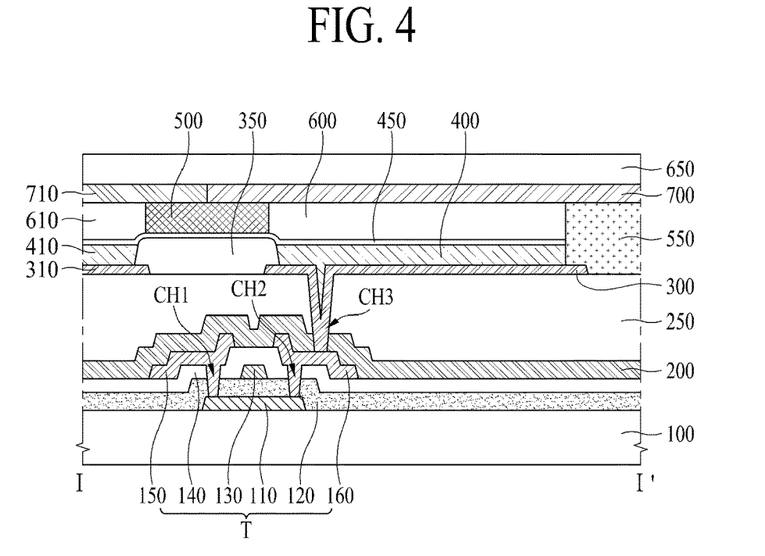
FIG. 4 is a cross-sectional view of the organic light emitting display device according to the embodiment of the present invention, which is a cross-sectional view taken along line I-I' in FIG. 3.

FIG. 3 is a plan view of the organic light emitting display device according to an embodiment of the present invention and is an enlarged view of the display panel 10 in the plan view of FIG. 2. FIG. 4 is a cross-sectional view of the organic light emitting display device according to the embodiment of the present invention, which is taken along line I-I' in FIG. 3.

Referring to FIG. 3, the organic light emitting display device according to the embodiment of the present invention includes a non-display area NA and a display area AA. The non-display area NA is disposed outside the display area AA. Various pads and drive units for applying signals to the display area AA are formed in the non-display area NA. The configuration of the non-display area NA can be modified in various forms known in the art. A plurality of pixels P are arranged horizontally and vertically in the display area AA.

The organic light emitting display device according to the embodiment of the present invention includes the first substrate 100 and the second substrate 650. For example, the first substrate 100 can serve as a lower substrate. A thin film transistor T, a passivation layer 200, a planarization layer 250, first electrodes 300 and 310, a bank 350, first and second organic light-emitting layers 400 and 410, a second electrode 450, a light-blocking layer 500, a dam 550, and first and second resin layers 600 and 610 are formed on the first substrate 100.

The thin film transistor T includes an active layer 110, a gate insulating film 120, a gate electrode 130, an insulating interlayer 140, a source electrode 150, and a drain electrode 160.

The active layer 110 is disposed on the first substrate 100 to be superimposed on the gate electrode 130. The active layer 110 may be formed of a silicon-based semiconductor material or an oxide-based semiconductor material. Although not illustrated in the drawing, a light-blocking film may be additionally formed between the first substrate 100 and the active layer 110.

The gate insulating film 120 is disposed on the active layer 110. The gate insulating film 120 insulates the gate electrode 130 from the active layer 110. At this time, the gate insulating film 120 may be formed of an inorganic insulating material such as a silicon oxide film (SiOX), a silicon nitride film (SiNX), or a multi-layered film thereof, but is not limited thereto.

The gate electrode 130 is disposed on the gate insulating film 120. The gate electrode 130 is formed to be superimposed on the active layer 110 with the gate insulating film 120 interposed therebetween. Here, the gate electrode 130 may be a single layer or a multiple layer which is formed of one of molybdenum (Mo), aluminum (Al), chromium (Cr), gold (Au), titanium (Ti), nickel (Ni), neodymium (Nd), and copper (Cu) or alloy thereof, but is not limited thereto.

The insulating interlayer 140 is formed on the gate electrode 130. The insulating interlayer 140 may be formed of the same inorganic insulating material as the gate insulating film 120 such as a silicon oxide film (SiOX), a silicon nitride film (SiNX), or a multi-layered film thereof, but is not limited thereto.

The source electrode 150 and the drain electrode 160 are disposed to face each other on the insulating interlayer 140. A first contact hole CH1 for exposing one end area of the active layer 110 and a second contact hole CH2 for exposing the other end area of the active layer 110 are formed in the gate insulating film 120 and the insulating interlayer 140. Here, the source electrode 150 is connected to the other area of the active layer 110 via the first contact hole CH1, and the drain electrode 160 is connected to one end area of the active layer 110 via the second contact hole CH1.

The thin film transistor layer T is not limited to the illustrated structure, but can be modified in various configurations known in the art. For example, a top gate structure in which the gate electrode 130 is formed on the active layer 110 is illustrated in the drawing, but a bottom gate structure in which the gate electrode 130 is formed below the active layer 110 may be employed.

The passivation layer 200 is disposed on the thin film transistor layer T. The passivation layer 200 serves to protect the thin film transistor layer T. Here, the passivation layer 200 may be formed of an inorganic insulating material such as a silicon oxide film (SiOX), a silicon nitride film (SiNX), or a multi-layered film thereof, but is not limited thereto.

The planarization layer 250 is disposed on the passivation layer 200. The planarization layer 250 serves to planarize the top of the first substrate 100 including the thin film transistor T. Here, the planarization layer 250 may be formed of an organic insulating material such as an acrylic resin, an epoxy resin, a phenolic resin, a polyamide resin, or a polyimide resin, but is not limited thereto.

The first electrodes 300 and 310 are disposed on the planarization layer 250. A third contact hole CH3 for exposing the drain electrode 160 is formed in the passivation layer 200 and the planarization layer 250. The first electrode 300 is connected to the drain electrode 160 via the third contact hole CH3. That is, the first electrodes 300 and 310 are electrically connected to a thin film transistor T, respectively. Here, the first electrodes 300 and 310 are independently disposed for each pixel P and can serve as an anode electrode. The first electrodes 300 and 310 may be formed of indium tin oxide (Ito) or indium zinc oxide (IZO). The first electrodes 300 and 310 may include at least two layers containing a metal material having excellent reflection efficiency, such as molybdenum (Mo), an alloy (MoTi) molybdenum and titanium, aluminum (Al), silver (Ag), or APC (Ag; Pb; Cu).

The bank 350 is disposed on the first electrodes 300 and 310. Here, the bank 350 is disposed to be superimposed on a part of the first electrodes 300 and 310 to define pixel P area. That is, the bank 350 is disposed to expose the top surface of the first electrodes 300 and 310 and to cover a side face of the first electrode 300. The bank 350 is disposed to expose the top surface of the first electrodes 300 and 310 to secure an area in which an image is displayed. The bank 350 may be formed of an organic insulating material such as a polyimide resin, an acrylic resin, or benzocyclobutene (BCB), but is not limited thereto.

The organic light-emitting layers 400 and 410 are disposed on the first electrodes 300 and 310. Here, the first organic light-emitting layer 400 and the second organic light-emitting layer 410 are independently disposed in different pixels P with respect to the bank 350. The organic light-emitting layers 400 and 410 may include a hole injecting layer, a hole transporting layer, a light-emitting layer, an electron transporting layer, and an electron injecting layer. The structure of the organic light-emitting layers 400 and 410 can be modified in various forms known in the art.

The second electrode 450 is disposed on the organic light-emitting layers 400 and 410. Here, when the first electrodes 300 and 310 serve as an anode electrode, the second electrode 450 may serve as a cathode electrode. The second electrode 450 is formed on a surface from which light is emitted and is thus formed of a transparent conductive material.

The light-blocking layer 500 is disposed on the bank 350. Here, the light-blocking layer 500 may be formed narrower than the bank 350. Since the light-blocking layer 500 is disposed not to be superimposed on the organic light-emitting layers 400 and 410 but to be superimposed only on the bank 350, the aperture ratio of the organic light emitting display device according to the embodiment of the present invention is not reduced. The light-blocking layer 500 is disposed at such a height to prevent light leakage between the neighboring pixels P and prevents a light leakage phenomenon between the neighboring pixels P. That is, the light-blocking layer 500 prevents light emitted from the first organic light-emitting layer 400 from being reflected to a side face and being mixed with light emitted from the second organic light-emitting layer 410. The light-blocking layer 500 may be formed as a black matrix (BM) using a metal material or a pigment that does not transmit light.

The dam 550 is disposed to surround the pixel P which is disposed at the outermost position of the display area AA. That is, the dam 550 is disposed in the form of a frame in the boundary with the non-display area NA. The dam 550 prevents a resin material filled in the display area AA from being dispersed to the non-display area NA.

The resin layers 600 and 610 are disposed on the second electrode 450 and are disposed between the light-blocking layer 500 and another light-blocking layer 500 or between the light-blocking layer 500 and the dam 550. Here, the resin layers 600 and 610 are disposed on both sides of the light-blocking layer 500. The resin layers 600 and 610 are disposed between the first substrate 100 and the second substrate 650 to prevent light loss, and include an adhesive material to increase an adhesive force between the first substrate 100 and the second substrate 650. Here, an air gap may be formed between the first substrate 100 and the second substrate 650. In this case, when light is reflected from the organic light-emitting layers 400 and 410 to the air gap, the light is diffused in the resin layers 600 and 610 and is not reflected to the second substrate 650, thereby decreasing the luminance or the contrast. Accordingly, the organic light emitting display device according to the embodiment of the present invention can prevent the problem of a decrease in luminance or contrast, because light emitted from the organic light-emitting layers 400 and 410 is prevented from reaching the second substrate 650 by filling a space between the first substrate 100 and the second substrate 650 with a resin material having a high refractive index.

On the other hand, the organic light emitting display device according to the embodiment of the present invention is configured by bonding the first substrate 100 and the second substrate 650. In the process of bonding the first and second substrates 100 and 650, both substrates are bonded to each other such that there is no gap between the light-blocking layer 500 and the bank 350 for the purpose of preventing the mixture of color light. When the first and second substrates 100 and 650 are bonded such that there is no gap between the light-blocking layer 500 and the bank 350, the resin layers 600 and 610 in the organic light emitting display device according to the related art are not connected or do not communicate due to the light-blocking layer 500 and the bank 350. Subsequently, it is difficult to fill all the resin layers 600 and 610 with the same amount of resin material. Thus, the pixels P in the organic light emitting display device according to the related art may be filled with different amounts of resin material. When the pixels P are not filled with the resin material uniformly, a pixel P may be filled with the resin material and an air gap may be formed therein. Here, another pixel P may be filled with a large amount of resin material and thus the adhesion uniformity of the first and second substrates 100 and 650 may decrease. Accordingly, the decrease in light uniformity may reduce image quality of the organic light emitting display device.

In order to solve the problem of lack of uniformity of the resin material, a resin transfer pattern is formed in the light-blocking layer 500 of the organic light emitting display device according to the embodiment of the present invention. Thus, the resin material can move via the resin transfer pattern even when the first and second substrates 100 and 650 are bonded such that there is no gap between the light-blocking layer 500 and the bank 350. The resin transfer pattern is formed to penetrate the light-blocking layer 500 from one side to the other side. Accordingly, the first resin layer 600 disposed on one side of the light-blocking layer 500 and the second resin layer 610 disposed on the other side are connected to each other via the resin transfer pattern. The light-blocking layer 500 is disposed to surround at least two sides of a pixel P, at least one resin transfer pattern is formed between the neighboring pixels P, and thus the resin layers 600 and 610 disposed on all the pixels P can be connected as one body. That is, the resin layers 600 and 610 disposed in the organic light emitting display device according to the embodiment of the present invention can be connected as one body via the resin transfer patterns. Accordingly, when the resin material is applied onto the first substrate so as to fill all the pixels P and the second substrate 650 is bonded to the first substrate 100 with a pressure of the weight of the second substrate 650, the resin material is uniformly dispersed via the resin transfer patterns. Accordingly, all the pixels P are uniformly filled with the resin material so as not to form an air gap, and it is possible to prevent a pixel from being filled with a larger amount of resin material to deteriorate the adhesion uniformity between the first and second substrates 100 and 650. Here, the resin transfer pattern provides a space for allowing the resin material to move, and is disposed in a shape which is turned, curved or bent at least one time so as not to pass light between the pixels P. In other words, one end and the other end of the resin transfer pattern do not face each other due to the shape of the resin transfer pattern which is turned at least one time.

Accordingly, the resin material can move between the first resin layer 600 and the second resin layer 610, but light does not pass between the first organic light-emitting layer 400 and the second organic light-emitting layer 410 due to the light-blocking layer 500. Alternative arrangements of the resin transfer pattern will be described later with reference to FIGS. 5 to 8.

In the organic light emitting display device according to the embodiment of the present invention, since the resin transfer pattern is formed in the light-blocking layer 500 so as to enable movement of the resin material but to prevent passing of light, the resin transfer pattern does not diminish the light-blocking layer 500 and can uniformly transfer the resin material to all the pixels P.

When the first substrate 100 serves as a lower substrate, the second substrate 650 can serve as an upper substrate. Color filters 700 and 710 are disposed on the second substrate 650.

The color filters 700 and 710 are disposed on the second substrate 650 so as to correspond to the areas of the pixels P. Here, the color filters 700 and 710 may include red, green, and blue color filters corresponding to the area of each pixel P. The color filters 700 and 710 include a first color filter 700 and a second color filter 710 of different colors. The light-blocking layer 500 is disposed between the first and second color filters 700 and 710.

In the organic light emitting display device according to the embodiment of the present invention, since the light-blocking layer 500 is not superimposed on the organic light-emitting layers 400 and 410, the aperture ratio does not decrease. In the organic light emitting display device according to the embodiment of the present invention, by disposing the resin transfer pattern in the light-blocking layer 500, it is possible to prevent a light leakage phenomenon and to uniformly transfer the resin material to all the pixels P. Accordingly, in the organic light emitting display device according to the embodiment of the present invention, it is possible to prevent a problem in that the adhesion uniformity between the first and second substrates 100 and 650 decreases or the image quality deteriorates due to the non-uniform resin layers.

Figure 5:
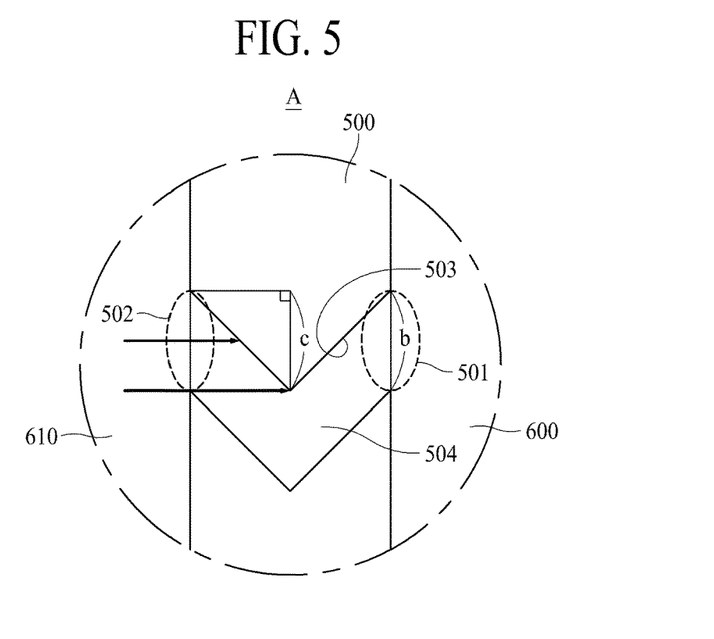
FIG. 5 is a cross-sectional view of a light-blocking layer according to a first embodiment of the present invention, which is an enlarged view of area A in FIG. 3.

FIG. 5 is a cross-sectional view of a light-blocking layer according to a first embodiment of the present invention and is an enlarged view of area A in FIG. 3. Referring to FIG. 5, the light-blocking layer 500 according to the first embodiment of the present invention is disposed between the first resin layer 600 and the second resin layer 610. The light-blocking layer 500 includes a resin transfer pattern and the resin transfer pattern is formed in a shape which is turned at least one time. Here, the resin transfer pattern includes introduction portions 501 and 502, a light-blocking portion 503, and a resin transfer portion 504.

The introduction portions 501 and 502 are holes which are disposed to transfer the resin material and include a first introduction portion 501 connected to the first resin layer 600 and a second introduction portion 502 connected to the second resin layer 610. Here, the introduction portions 501 and 502 have an introduction length b in the length direction of the light-blocking layer 500.

The light-blocking portion 503 is a turned portion which is a portion which is turned at least one time in the resin transfer pattern, and is disposed between the first introduction portion 501 and the second introduction portion 502 such that one end and the other end of the resin transfer pattern do not face each other. The light-blocking portion 503 is formed in a turned shape so as not to transmit light and prevents a light leakage phenomenon between the first resin layer 600 and the second resin layer 610. That is, light incident from the introduction portions 501 and 502 is not transmitted and neither reflected by the light-blocking portion 503 and is blocked by the light-blocking portion 503. Accordingly, light incident on the first introduction portion 501 from the first resin layer 600 is not incident on the second resin layer 610 due to the light-blocking portion 503, and light incident on the second introduction portion 502 from the second resin layer 610 is not incident on the first resin layer 600 due to the light-blocking portion 503. Both sides of the light-blocking portion 503 protrude to one side from the ends of the introduction portions 501 and 502. Here, the light-blocking portion 503 has a blocking length c in the length direction of the light-blocking layer 500 from a position at which one sides of the introduction portions 501 and 502 and the end of the light-blocking portion 503 meet each other at the right angle to the end of the light-blocking portion 503. When the blocking length c is smaller than the introduction length b, light may leak from the resin transfer pattern. Accordingly, the blocking length c is set to be equal to or larger than the introduction length b.

The resin transfer portion 504 is a passage which is disposed to allow movement of the resin material. Here, the resin transfer portion 504 may be separated from the light-blocking portion 503 by the introduction length b and may be disposed symmetric in the same shape as the light-blocking portion 503, but is not limited thereto. The resin transfer portion 504 is connected to the introduction portions 501 and 502 such that the resin material can move between the first resin layer 600 and the second resin layer 610. That is, when the first resin layer 600 contains a large amount of resin material, the resin material is transferred from the first resin layer 600 to the first introduction portion 501 and the resin material can move to the second introduction portion 502 via the resin transfer portion 504. When the second resin layer 610 contains a large amount of resin material, the resin material is transferred from the second resin layer 610 to the second introduction portion 502 and the resin material can move to the first introduction portion 501 via the resin transfer portion 504.

In the light-blocking layer 500 according to the first embodiment of the present invention, by forming the resin transfer pattern, it is possible to prevent the light leakage phenomenon and to uniformly disperse the resin material to all the pixels P. Accordingly, the organic light emitting display device according to the first embodiment of the present invention can prevent the problem in that the adhesion uniformity between the first and second substrates 100 and 650 decreases or the image quality deteriorates due to the non-uniform resin layer.

Figure 6:
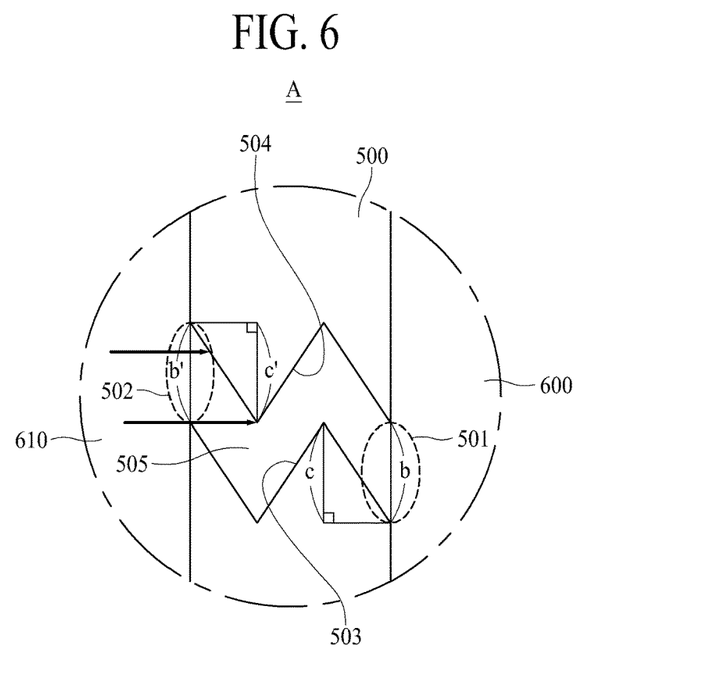
FIG. 6 is a cross-sectional view of a light-blocking layer according to a second embodiment of the present invention, which is an enlarged view of area A in FIG. 3.

FIG. 6 is a cross-sectional view of a light-blocking layer according to a second embodiment of the present invention and is an enlarged view of area A in FIG. 3. This light-blocking layer is different from the light-blocking layer according to the first embodiment illustrated in FIG. 5 in the arrangement of the resin transfer pattern.

Referring to FIG. 6, the light-blocking layer 500 according to the second embodiment of the present invention is disposed between the first resin layer 600 and the second resin layer 610. The light-blocking layer 500 includes a resin transfer pattern and the resin transfer pattern includes introduction portions 501 and 502, light-blocking portions 503 and 504, and a resin transfer portion 505.

The introduction portions 501 and 502 are holes or openings which are disposed to transfer the resin material and includes a first introduction portion 501 connected to the first resin layer 600 and a second introduction portion 502 connected to the second resin layer 610. Here, the first introduction portion 501 has a first introduction length b in the length direction of the light-blocking layer 500, and the second introduction portion 502 has a second introduction length b' in the length direction of the light-blocking layer 500.

The light-blocking portions 503, 504 are turned portions which are disposed so as not to transmit light through the resin transfer pattern, and include a first light-blocking portion 503 and a second light-blocking portion 504. The light-blocking portions 503 and 504 prevent a light leakage phenomenon between the first resin layer 600 and the second resin layer 610. That is, light incident from the introduction portions 501 and 502 is neither transmitted nor reflected by the light-blocking portions 503 and 504 and is blocked by the light-blocking portions 503 and 504. Accordingly, light incident on the first introduction portion 501 from the first resin layer 600 is not incident on the second resin layer 610 due to the first light-blocking portion 503, and light incident on the second introduction portion 502 from the second resin layer 610 is not incident on the first resin layer 600 due to the second light-blocking portion 504. The first light-blocking portion 503 is formed in a shape of which one side is turned two times from one end of the first introduction portion 501. Here, the first light-blocking portion 503 has a blocking length c in the length direction of the light-blocking layer 500 from a position at which one sides of the introduction portions 501 and 502 and the end of the light-blocking portion 503 meet each other at the right angle to the end of the light-blocking portion 503. The second light-blocking portion 504 is formed in a shape of which one side is turned two times from one end of the second introduction portion 502. Here, the second light-blocking portion 504 has a blocking length c' in the length direction of the light-blocking layer 500 from a position at which one of the sides of the introduction portions 501 and 502 and the end of the light-blocking portion 503 meet each other at the right angle to the end of the light-blocking portion 504. When the first blocking length c is smaller than the first introduction length b, light may leak from the resin transfer pattern. Accordingly, the first blocking length c is set to be equal to or larger than the first introduction length b. When the second blocking length c' is smaller than the second introduction length b', light may leak from the resin transfer pattern. Accordingly, the second blocking length c' is set to be equal to or larger than the second introduction length b'.

The resin transfer portion 505 is a passage which is disposed to allow movement of the resin material. Here, the resin transfer portion 505 may be separated from the light-blocking portions 503 and 504 by the introduction lengths b and b' and may be disposed symmetric in the same shape as the light-blocking portions 503 and 504, but is not limited thereto. The resin transfer portion 505 is connected to the introduction portions 501 and 502 such that the resin material can move between the first resin layer 600 and the second resin layer 610. That is, when the first resin layer 600 contains a large amount of resin material, the resin material is transferred from the first resin layer 600 to the first introduction portion 501 and the resin material can move to the second introduction portion 502 via the resin transfer portion 505. When the second resin layer 610 contains a large amount of resin material, the resin material is transferred from the second resin layer 610 to the second introduction portion 502 and the resin material can move to the first introduction portion 501 via the resin transfer portion 505.

In the light-blocking layer 500 according to the second embodiment of the present invention, by forming the resin transfer pattern, it is possible to prevent the light leakage phenomenon and to uniformly disperse the resin material to all the pixels P. Accordingly, the organic light emitting display device according to the second embodiment of the present invention can prevent the problem in that the adhesion uniformity between the first and second substrates 100 and 650 decreases or the image quality deteriorates due to the non-uniform resin layer.

Figure 7:
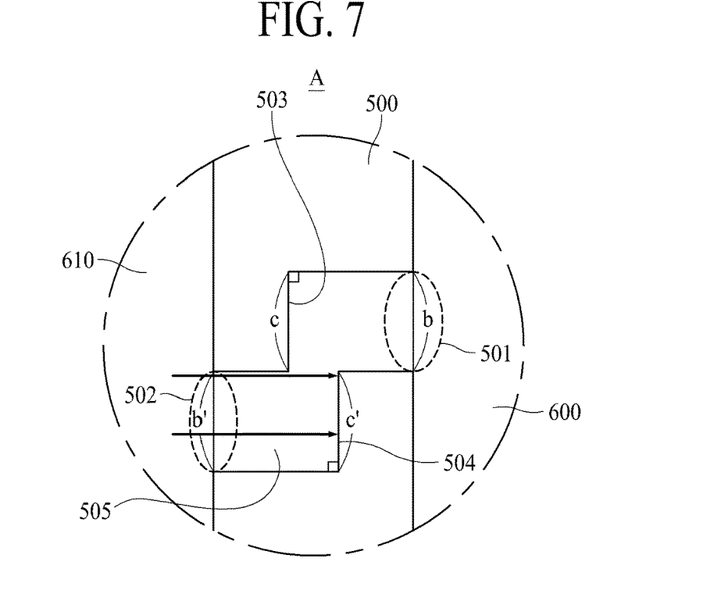
FIG. 7 is a cross-sectional view of a light-blocking layer according to a third embodiment of the present invention, which is an enlarged view of area A in FIG. 3.

FIG. 7 is a cross-sectional view of a light-blocking layer according to a third embodiment of the present invention and is an enlarged view of area A in FIG. 3. This light-blocking layer is different from the light-blocking layer according to the first embodiment illustrated in FIG. 5 in the arrangement of the resin transfer pattern.

Referring to FIG. 7, The light-blocking layer 500 according to the third embodiment of the present invention is disposed between the first resin layer 600 and the second resin layer 610. The light-blocking layer 500 includes a resin transfer pattern and the resin transfer pattern includes introduction portions 501 and 502, light-blocking portions 503 and 504, and a resin transfer portion 505.

The introduction portions 501 and 502 are holes which are disposed to transfer the resin material and includes a first introduction portion 501 connected to the first resin layer 600 and a second introduction portion 502 connected to the second resin layer 610. Here, the first introduction portion 501 has a first introduction length b in the length direction of the light-blocking layer 500, and the second introduction portion 502 has a second introduction length b' in the length direction of the light-blocking layer 500.

The light-blocking portions 503 and 504 are turned portions which are disposed so as not to transmit light through the resin transfer pattern, and include a first light-blocking portion 503 and a second light-blocking portion 504. The light-blocking portions 503 and 504 prevent a light leakage phenomenon between the first resin layer 600 and the second resin layer 610. That is, light incident from the introduction portions 501 and 502 is neither transmitted nor reflected by the light-blocking portions 503 and 504 and is blocked by the light-blocking portions 503 and 504. Accordingly, light incident on the first introduction portion 501 from the first resin layer 600 is not incident on the second resin layer 610 due to the first light-blocking portion 503, and light incident on the second introduction portion 502 from the second resin layer 610 is not incident on the first resin layer 600 due to the second light-blocking portion 504. The first light-blocking portion 503 is formed in a shape facing the first introduction portion 501. Here, the first light-blocking portion 503 has a blocking length c in the length direction of the light-blocking layer 500 from a position at which one side of the introduction portions 501 and 502 and the end of the light-blocking portion 503 meet each other at the right angle to the end of the light-blocking portion 503. The second light-blocking portion 504 is formed in a shape facing the second introduction portion 502. Here, the second light-blocking portion 504 has a blocking length c' in the length direction of the light-blocking layer 500 from a position at which one sides of the introduction portions 501 and 502 and the end of the light-blocking portion 504 meet each other at the right angle to the end of the light-blocking portion 504. When the first blocking length c is smaller than the first introduction length b, light may leak from the resin transfer pattern. Accordingly, the first blocking length c is set to be equal to or larger than the first introduction length b. When the second blocking length c' is smaller than the second introduction length b', light may leak from the resin transfer pattern. Accordingly, the second blocking length c' is set to be equal to or larger than the second introduction length b'.

The resin transfer portion 505 is a passage which is disposed to allow movement of the resin material. The resin transfer portion 505 is connected to the introduction portions 501 and 502 such that the resin material can move between the first resin layer 600 and the second resin layer 610. That is, when the first resin layer 600 contains a large amount of resin material, the resin material is transferred from the first resin layer 600 to the first introduction portion 501 and the resin material can move to the second introduction portion 502 via the resin transfer portion 505. When the second resin layer 610 contains a large amount of resin material, the resin material is transferred from the second resin layer 610 to the second introduction portion 502 and the resin material can move to the first introduction portion 501 via the resin transfer portion 505.

In the light-blocking layer 500 according to the third embodiment of the present invention, by forming the resin transfer pattern, it is possible to prevent the light leakage phenomenon and to uniformly disperse the resin material to all the pixels P. Accordingly, the organic light emitting display device according to the third embodiment of the present invention can prevent the problem in that the adhesion uniformity between the first and second substrates 100 and 650 decreases or the image quality deteriorates due to the non-uniform resin layer.

Figure 8:
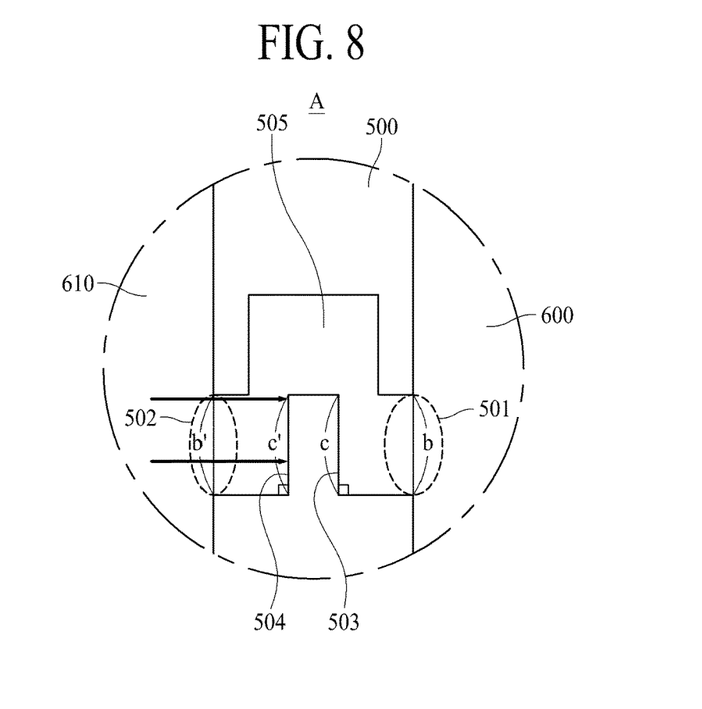
FIG. 8 is a cross-sectional view of a light-blocking layer according to a fourth embodiment of the present invention, which is an enlarged view of area A in FIG. 3.

FIG. 8 is a cross-sectional view of a light-blocking layer according to a fourth embodiment of the present invention and is an enlarged view of area A in FIG. 3. This light-blocking layer has the same structure as the light-blocking layer according to the third embodiment except for the structure of the resin transfer pattern. In the following description, only the resin transfer portion will be described and description of the same structure will not be repeated.

The resin transfer portion is a passage which is disposed to allow movement of the resin material and is disposed to penetrate the light-blocking layer 500 from one side to the other side. The resin transfer portion 505 is connected to the introduction portions 501 and 502 such that the resin material can move between the first resin layer 600 and the second resin layer 610. That is, when the first resin layer 600 contains a large amount of resin material, the resin material is transferred from the first resin layer 600 to the first introduction portion 501 and the resin material can move to the second introduction portion 502 via the resin transfer portion 505. When the second resin layer 610 contains a large amount of resin material, the resin material is transferred from the second resin layer 610 to the second introduction portion 502 and the resin material can move to the first introduction portion 501 via the resin transfer portion 505. Unlike the light-blocking layers 500 according to the first to third embodiments, in the light-blocking layer 500 according to the fourth embodiment of the present invention, the ends of the light-blocking layers 500 which are separated by the resin transfer portion are not symmetric in the same shape but the light-blocking layer is formed in a different shape. That is, one end of the light-blocking layer which is separated by the resin transfer portion is formed in a groove shape, and the other end is formed in a protrusion shape which is protruding into the groove.

In the light-blocking layer 500 according to the fourth embodiment of the present invention, by forming the resin transfer pattern, it is possible to prevent the light leakage phenomenon and to uniformly disperse the resin material to all the pixels P. Accordingly, the organic light emitting display device according to the fourth embodiment of the present invention can prevent the problem in that the adhesion uniformity between the first and second substrates 100 and 650 decreases or the image quality deteriorates due to the non-uniform resin layer.

FIGS. 9A to 9D are cross-sectional views illustrating steps of a method of manufacturing an organic light emitting display device according to an embodiment of the present invention and illustrates the method of manufacturing the organic light emitting display device illustrated in FIG. 3. Accordingly, the same elements will be referenced by the same reference numerals and description of the same materials and structures will not be repeated.

Figure 9A:
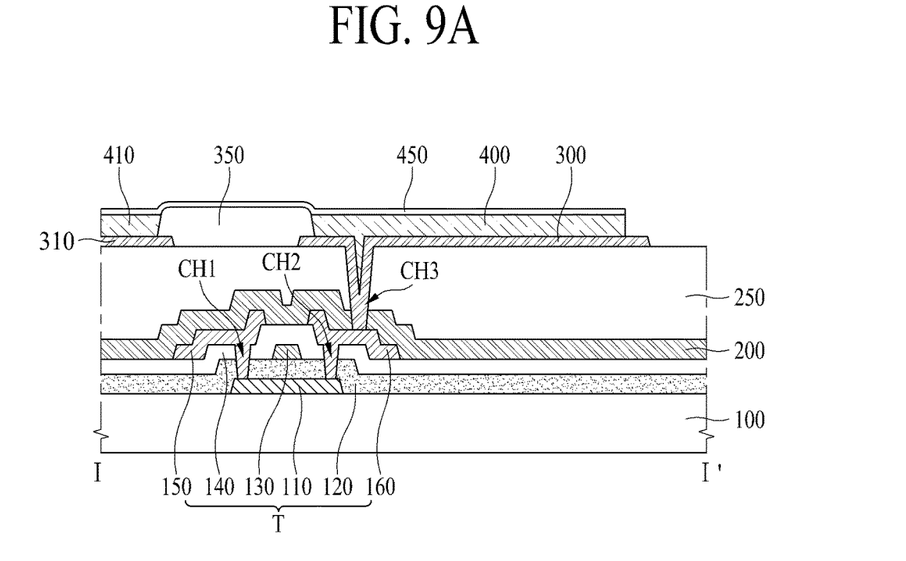
FIGS. 9A to 9D are cross-sectional views illustrating steps of a method of manufacturing an organic light emitting display device according to an embodiment of the present invention.

First, as illustrated in FIG. 9A, a thin film transistor T is formed on a first substrate 100, a passivation layer 200 is formed on the thin film transistor T, and a planarization layer 250 is formed on the passivation layer 200.

The step of forming the thin film transistor T includes steps of forming an active layer 110 on the first substrate 100, forming a gate insulating film 120 on the active layer 110, forming a gate electrode 130 on the gate insulating film 120, forming an insulating interlayer 140 on the gate electrode 130, forming first and second contact holes CH1 and CH2 in the insulating interlayer 140 and the gate insulating film 120, and forming source and drain electrodes 150 and 160 on the insulating interlayer 140 so as to be connected to the active layer 110 via the first and second contact holes CH1 and CH2. The step of forming the thin film transistor T can employ various methods known in the art.

After the passivation layer 200 and the planarization layer 250 are formed, a step of forming a third contact hole CH3 in the passivation layer 200 and the planarization layer 250 so as to expose the drain electrode 160 of the thin film transistor T is performed, and first electrodes 300 and 310 are formed to be electrically connected to the drain electrode 160 via the third contact hole CH3.

Figure 9B:
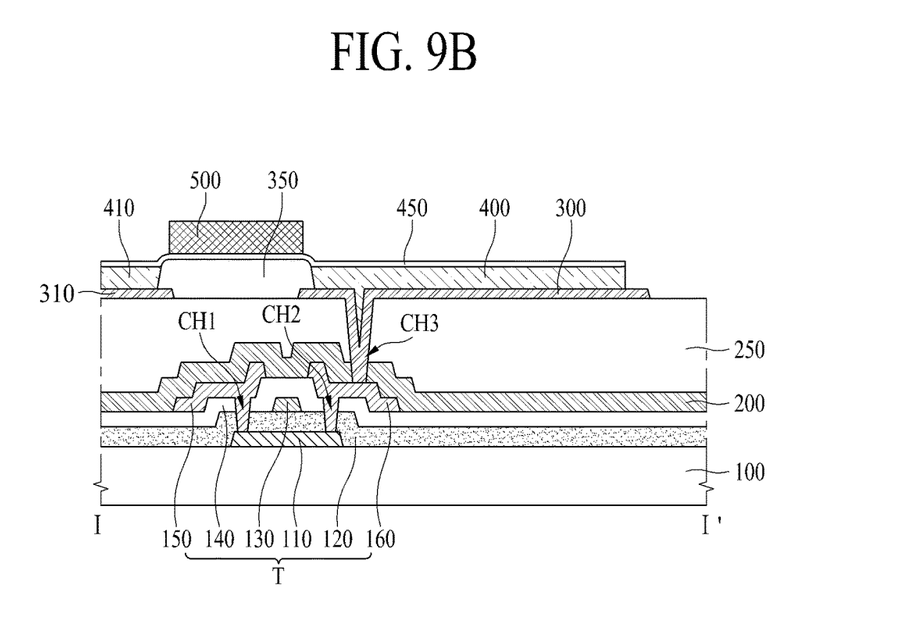

After the first electrodes 300 and 310 are formed, a bank 350 is formed on side faces of the first electrodes 300 and 310 except for the side face of the first electrode 300 located at the boundary of the display area AA. Then, organic light-emitting layers 400 and 410 are formed on the first electrodes 300 and 310, and a second electrode 450 is formed on the organic light-emitting layers 400 and 410. Then, as illustrated in FIG. 9B, a light-blocking layer 500 is formed on the bank 350.

Examples of how to produce or manufacture the resin transfer pattern, either as fully inside the light blocking layer or between the second electrode and the light blocking layer or between the light blocking layer and the color filter are described.

Figure 9C:
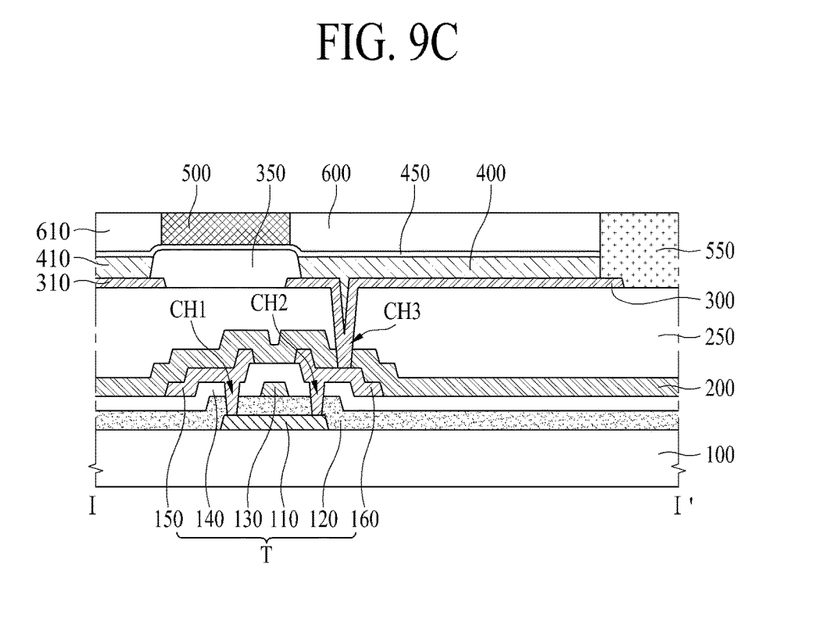

As illustrated in FIG. 9C, a dam 550 is formed on the side surface of the first electrode 300 located at the boundary of the display area AA. At this time, the height of the dam 550 is set to be equal to the height of the light-blocking layer 500. Then, an amount of resin material sufficient to fill the space between the dam 550 and the light-blocking layer 500 is applied onto the second electrode 450 to form first resin 600.

Figure 9D:
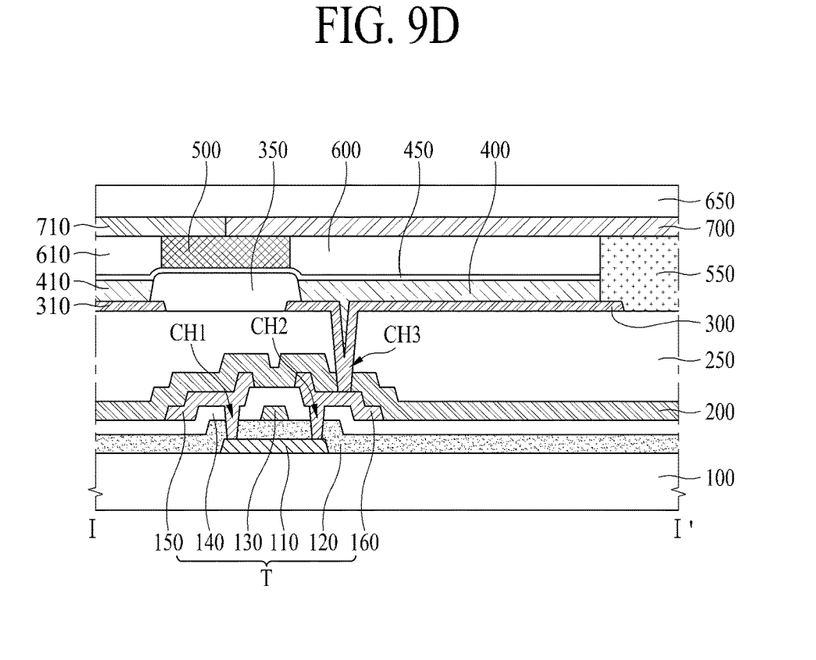

Then, as illustrated in FIG. 9D, a second substrate 650 in which color filters 700 and 710 are formed on a second glass 650 is bonded to the first substrate 100.

In the method of manufacturing an organic light emitting display device according to the embodiment of the present invention, by forming the light-blocking layer 500 directly on the bank 350 of the first substrate 100, it is possible to prevent a problem in that the light-blocking layer 500 is disposed to be superimposed on the display area to decrease the aperture ratio of the organic light emitting display device in the step of bonding the first and second substrates 100 and 650.

As described above, the resin transfer pattern in the organic light emitting display device according to the embodiments of the present invention is disposed in the light-blocking layer so as to allow movement of the resin material but not to transmit light, and thus does not diminish the light-blocking layer and can uniformly disperse the resin material to all the pixels.

The method of manufacturing an organic light emitting display device according to the embodiments of the present invention can prevent a problem in that the light-blocking layer is disposed to be superimposed on the display area to decrease the aperture ratio of the organic light emitting display device.

Advantages of the invention are not limited to the above-mentioned advantages, and other advantages which are not mentioned above will be able to be clearly understood by those skilled in the art.

While embodiments of the present invention have been described in detail with reference to the accompanying drawings, the invention is not limited to the embodiments, but can be modified in various forms without departing from the technical spirit of the invention. Accordingly, the embodiments of the invention are not provided to limit the technical spirit of the invention but to explain the technical sprit of the invention, and the technical spirit of the invention is not limited to the embodiments. Therefore, it should be understood that the above-mentioned embodiments are exemplary but are not restrictive in all terms. The scope of the invention should be analyzed on the basis of the appended claims and it should be analyzed that all the technical concepts equivalent thereto are included in the scope of the invention.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

What is claimed is:

1. A light emitting display device comprising:
   first electrodes disposed on a first substrate;
   light-emitting layers disposed on the first electrodes;
   a bank that overlaps edges of the first electrodes and defines boarders of pixels;
   a light-blocking layer disposed on the bank;
   resin layers disposed on the light-emitting layers;
   a resin transfer pattern being a passage in the light-blocking layer for connecting the resin layers of adjacent pixels, and configured to allow movement of a resin between the resin layers; and
   a second substrate disposed on the resin layers,
   wherein the resin transfer pattern includes introduction portions orientated to adjacent resin layers, and
   wherein the introduction portions are offset to each other to block transmission of light from one introduction portion to another introduction portion of the resin transfer pattern.

2. The light emitting display device according to claim 1, wherein the resin transfer pattern penetrates the light-blocking layer from one side to the other side and is formed in the light-blocking layer.

3. The light emitting display device according to claim 1, wherein the resin layer disposed on one side of the light-blocking layer and the resin layer disposed on the other side of the light-blocking layer are connected to each other via the resin transfer pattern.

4. The light emitting display device according to claim 3, wherein one end of the resin transfer pattern disposed on the one side of the light blocking layer and the other end of the resin transfer pattern disposed on the other side of the light blocking layer do not face each other.

5. The light emitting display device according to claim 1, wherein the resin transfer pattern is formed inside the light-blocking layer and is formed in a curved form allowing a fluid to pass and blocking the passing of light.

6. The light emitting display device according to claim 1, wherein the light-blocking layer is disposed to surround at least two sides of each of the pixels and the adjacent pixels.

7. The light emitting display device according to claim 1, wherein at least one resin transfer pattern is disposed between the adjacent pixels.

8. The light emitting display device according to claim 1, wherein the resin transfer pattern of the adjacent pixels is disposed to connect the resin layers as one body.

9. The light emitting display device according to claim 1, wherein the bank is wider than the light-blocking layer disposed on the bank.

10. The light emitting display device according to claim 1, wherein the introduction portions are offset to each other by at least a diameter or width of one introduction portion.

11. The light emitting display device according to claim 1, wherein the resin transfer pattern includes at least one curvature or angle blocking transmission of light from one introduction portion to the other introduction portion of the resin transfer pattern.

12. The light emitting display device according to claim 1, wherein the resin transfer pattern is partly or fully surrounded by the light blocking layer.

13. The light emitting display device according to claim 1, wherein one end of the resin transfer pattern disposed on one side of the light blocking layer has an introduction length, and an interior of the resin transfer pattern has a blocking length, and
   wherein the blocking length is equal to or greater than the introduction length.

* * * * *